United States Patent [19]
Pascucci

[11] Patent Number: 5,959,476
[45] Date of Patent: Sep. 28, 1999

[54] CIRCUIT AND METHOD FOR GENERATING A POWER-ON RESET SIGNAL

[75] Inventor: Luigi Pascucci, Sesto San Giovanni, Italy

[73] Assignee: SGS-Thomson Microelectronics S.r.L., Agrate Brianza, Italy

[21] Appl. No.: 08/828,791

[22] Filed: Mar. 27, 1997

[30] Foreign Application Priority Data

Mar. 29, 1996 [EP] European Pat. Off. .............. 96830177

[51] Int. Cl.[6] ...................................................... H03L 7/00
[52] U.S. Cl. .......................... 327/143; 327/142; 327/198
[58] Field of Search ..................................... 327/142, 143, 327/198

[56] References Cited

U.S. PATENT DOCUMENTS

| | | | |
|---|---|---|---|
| 4,366,560 | 12/1982 | McDermott et al. | 365/228 |
| 4,386,281 | 5/1983 | Terry | 307/200 B |
| 4,902,910 | 2/1990 | Hsieh | 327/143 |
| 5,039,875 | 8/1991 | Chang | 307/272.3 |
| 5,151,614 | 9/1992 | Yamazaki et al. | 307/272.3 |
| 5,172,012 | 12/1992 | Ueda | 307/272.3 |
| 5,321,317 | 6/1994 | Pascucci et al. | 307/296.4 |
| 5,489,863 | 2/1996 | Saijo | 327/142 |

FOREIGN PATENT DOCUMENTS 0 544 380 A2  6/1993  European Pat. Off. .......... G11C 7/00

OTHER PUBLICATIONS

European Search Report for European patent application 96830177, filed Mar. 29, 1996.
Patent abstracts of Japan, vol. 8, No. 272 (E–284)[1709], Dec. 13, 1984 & JP–A–59 141828 Sakuma Aaug. 14, 1984.
Patent abstracts of Japan, vol. 13, No. 142 (E–739), Apr. 7, 1989 & JP–A–63 304712 Susumu Dec. 13, 1988.
Patent abstracts of Japan, vol. 8, No. 63 (E–233), Mar. 24, 1984 & JP–A–58 210769 Masateru Dec. 8, 1983.

*Primary Examiner*—Toan Tran
*Assistant Examiner*—An T. Luu
*Attorney, Agent, or Firm*—Wolf, Greenfield & Sacks, P.C.

[57] ABSTRACT

The circuit, integrated in a device, includes a generating stage generating a POR pulse and a bump detector detecting bump conditions on the common supply line and enabling the generating stage in the presence of a bump. A bump supply line is connected to a holding capacitor and to the common supply line via an isolation stage. The isolation stage connects the common supply line and the bump supply line in the absence of a bump, and isolates the bump supply line in the presence of a bump. The bump detector is connected to the common supply line and to the bump supply line to generate the POR pulse when the common supply line falls beyond a given level below the voltage of the bump supply line. The circuit is also used to generate a POR pulse in the presence of a low supply voltage and when the device is turned off, to ensure correct operation of the device.

38 Claims, 3 Drawing Sheets

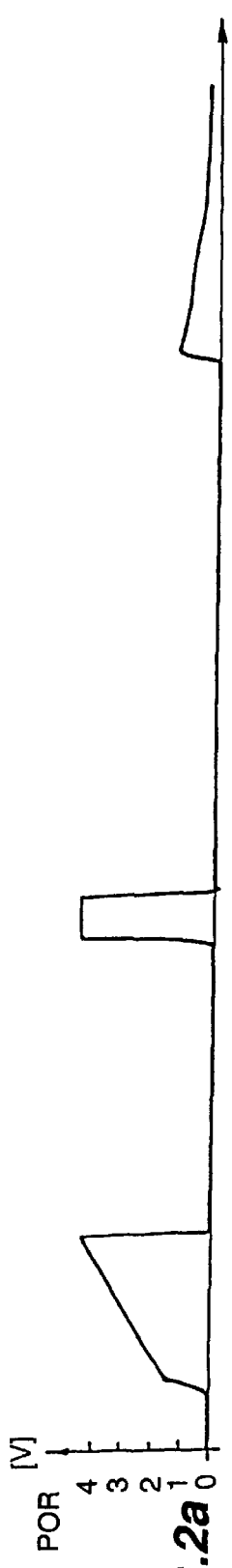
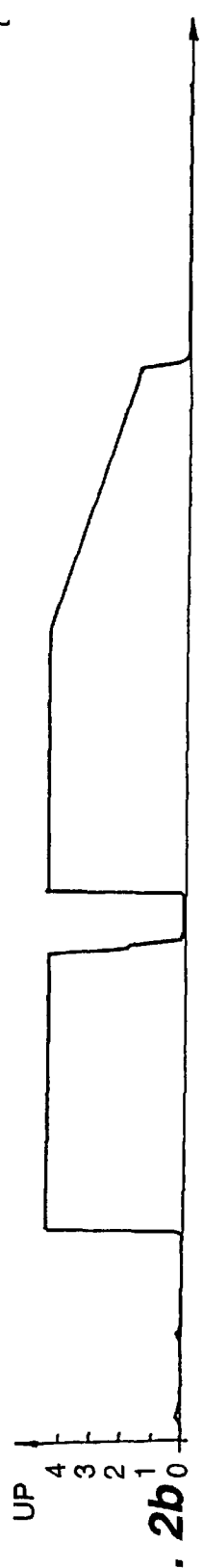
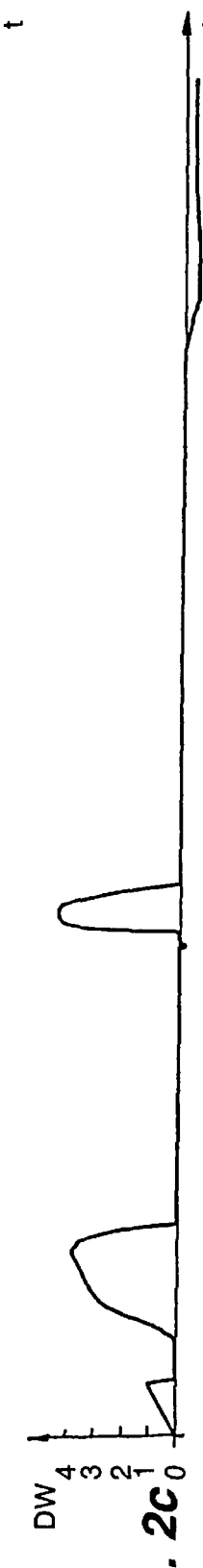
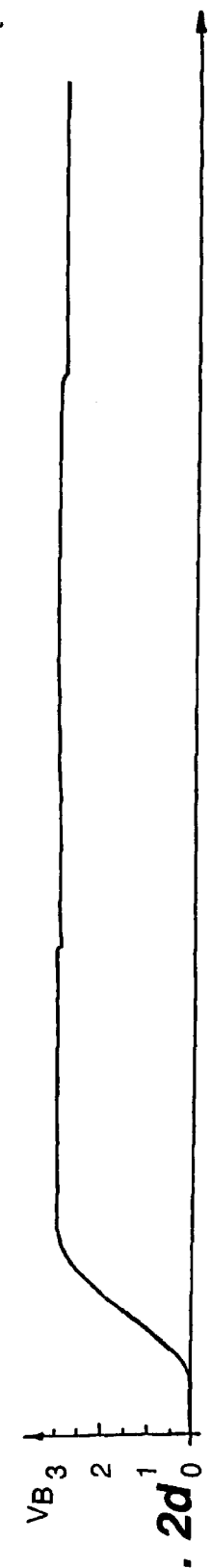
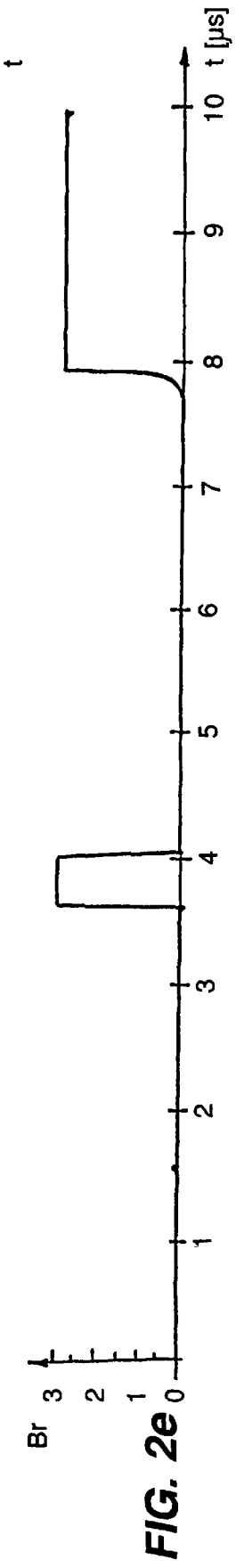

CIRCUIT AND METHOD FOR GENERATING A POWER-ON RESET SIGNAL

BACKGROUND OF THE INVENTION

1. Field of the Invention

The present invention relates integrated circuits and more particularly, to a circuit for generating to a power-on reset (POR) signal after a sudden variation in supply voltage.

2. Discussion of Related Art

In integrated devices, and particularly in nonvolatile memories, POR signal generating circuits are frequently used to initialize the various parts of the device and ensure a definite start state. Known circuits only function correctly if activated by rising transitions in supply voltage, which is normally an acceptable condition in devices with adequate protection against a sudden fall in supply. However, in some devices featuring timed circuits or comprising flip-flops or latches, the above stability condition is impaired by any sudden noise on the power supply line resulting in a marked, rapid fall (bump) in supply. This fall in supply in supply may result in errors, which are only recoverable by turning off and re-initializing the device and may be accompanied by a loss of data.

SUMMARY OF THE INVENTION

It is an object of the present invention to provide a POR signal generating circuit, which, in addition to the usual pulse when the device is turned on, also provides for producing a further initialization pulse following a sudden variation in supply voltage.

According to the present invention, there is provided a power-on reset signal generating circuit which includes a first line at a first reference potential and a stage for generating the POR pulse when a voltage drop (bump) is detected on the first line. When a bump is detected, an enabling signal is sent to the generating stage from a bump supply line which is precharged during normal operation of a device. The bump supply line is isolated once a bump is detected and acts as a source to reset the generating stage and generate the POR pulse.

The present invention ensures the POR pulse is only terminated when the memory cells of the device are at a voltage which allows correct reading of the cells.

BRIEF DESCRIPTION OF THE DRAWINGS

Two preferred, non-limiting embodiments of the present invention will be described by way of example with reference to the accompanying drawings, in which:

FIG. 2 shows a time plot of a number of electric quantities in the FIG. 1 diagram;

DETAILED DESCRIPTION

Figure 1:
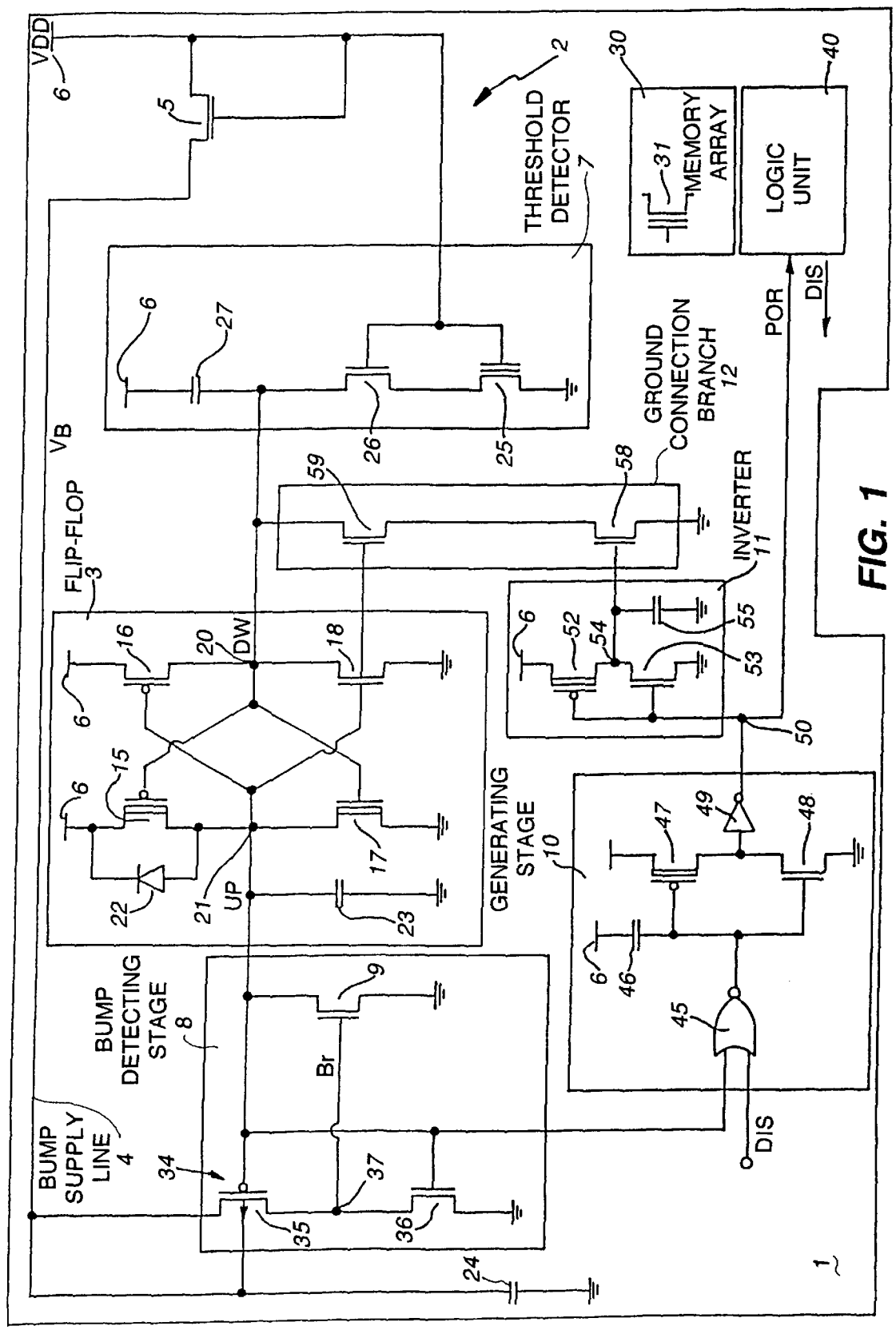
FIG. 1 shows a circuit diagram of a first embodiment of the present invention.

FIG. 1 shows an embodiment of the present invention in which a POR signal generating circuit 2 is integrated in device 1, in particular, a nonvolatile memory, such as an EPROM.

Circuit 2 substantially comprises a flip-flop 3 intentionally unbalanced and presenting a weak grounding path, a bump supply line 4, and an isolation transistor 5 interposed between bump supply line 4 and a common supply line 6 (at voltage $V_{DD}$) for supplying the whole of device 1. Threshold detector 7 is connected to flip-flop 3 and to supply line 6, a bump detecting stage 8 is connected to the output of flip-flop 3, and a POR (power-on reset) signal generating stage 10 is connected to the output of flip-flop 3. Inverter 11 is connected to the output of generating stage 10, and a ground connection branch 12 is connected to the output of inverter 11 and to flip-flop 3.

More specifically, flip-flop 3 comprises a first and second PMOS transistor 15, 16, and a first and second NMOS transistor 17, 18. The first PMOS transistor 15 is a native type (with a high threshold, not modified during fabrication), and has the source terminal connected to common supply line 6, the gate terminal connected to an input node 20 (presenting a DW signal), and the drain terminal connected to an output node 21 of flip-flip 3 (presenting an UP signal). The second PMOS transistor 16 has the source terminal connected to common supply line 6, the gate terminal connected to output node 21, and the drain terminal connected to input node 20. The first NMOS transistor 17 has the drain terminal connected to output node 21, the gate terminal connected to input node 20, and the source terminal grounded. The second NMOS transistor 18 presents a low size ratio ($W/L \leq 1$) and is therefore a resistive type, and has the drain terminal connected to input node 20, the gate terminal connected to output node 21, and the source terminal grounded.

By virtue of its high resistivity, second NMOS transistor 18 defines a weak grounding path, i.e. even when turned on, transistor 18 fails to ensure effective grounding of input node 20 in the presence of voltages which bring node 20 to a different potential, as explained in more detail below.

FIG. 1 also shows a diode 22 associated with (and deriving in known manner from the implementation of) first PMOS transistor 15, which intervenes at a given operating step of circuit 2. Capacitor 23 is interposed between output node 21 of flip-flop 3 and the ground line.

Bump supply line 4 is connected to a first terminal of a holding capacitor 24, the other terminal of which is grounded. Isolation transistor 5 is a diode-connected NMOS type (i.e. with shorted drain and gate terminals) with the source terminal connected to bump supply line 4, and the drain terminal connected to common supply line 6.

Threshold detector 7 comprises a virgin nonvolatile memory cell 25 similar to the memory cells 31 forming a memory array 30 of device 1, an NMOS transistor 26, and a capacitor 27. More specifically, memory cell 25 (preferably surrounded by a number of other cells (not shown) to more closely simulate the operating conditions of cells 31 of memory array 30) has the source terminal grounded, the drain terminal connected to the source terminal of transistor 26, and the gate terminal connected to common supply line 6. Transistor 26 also has the gate terminal connected to common supply line 6, and the drain terminal connected to input node 20 of flip-flop 3. Capacitor 27 is interposed between input node 20 and common supply line 6.

Bump detecting stage 8 comprises an inverter 34 and an NMOS transistor 9. Inverter 34 comprises a PMOS transistor 35 and an NMOS transistor 36 with the gate terminals connected to each other and to output node 21 of flip-flop 3. The drain terminals are connected to each other and define an output node 37 presenting a Br signal. The source terminal and the well region of PMOS transistor 35 are connected to bump supply line 4. The source terminal and the well region of PMOS transistor 35 are connected to bump supply line 4. The source terminal of NMOS transistor 36 is grounded, and node 37 is connected to the gate terminal of transistor 9, the drain terminal of which is connected to output node 21 of flip-flop 3, and the source terminal of which is grounded.

Output node 21 of flip-flop 3 is also connected to one input of a NOR gate 45 forming part of generating stage 10, and which presents a second input receiving a disabling signal DIS generated by a logic unit 40 of device 1 for disabling generation of the POR signal. The output of NOR gate 45 is connected to common supply line 6 via a capacitor 46, and to the gate terminals of a PMOS transistor 47 and NMOS transistor 48 defining an inverter. Transistor 47 is a native type with a high threshold for slightly delaying 0-to-1 switching of the output of inverter 47, 48 and the end of the bump pulse (as explained in more detail later on). The connected drain terminals of transistors 47, 48 are connected to an inverter 49, the output of which defines the output 50 of circuit 2, and supplies the POR signal to logic unit 40 to initialize the various parts of device 1.

Inverter 11 comprises a PMOS transistor 52 and NMOS transistor 53 with the gate terminals connected to each other and to output 50 of circuit 2. Transistor 52 is a native type with a high threshold for slightly delaying 0-to-1 switching of inverter 11 like transistor 47 and for the reasons explained below. The connected drain terminals of transistors 52, 53 define a node 54 to which is connected one terminal of a capacitor 55 (the other terminal of which is grounded).

Ground connection branch 12 comprises two NMOS transistors 58, 59 connected in series between input node 20 of flip-flop 3 and ground. More specifically, transistor 58 has the gate terminal connected to node 54, the source terminal grounded, and the drain terminal connected to the source terminal of transistor 59. Transistor 59 has the gate terminal connected to output node 21 of flip-flop 3, and the drain terminal connected to input node 20 of flip-flop 3.

With reference also to FIG. 2, circuit 2 in FIG. 1 operates as follows.

When device 1 is turned on and supply voltage $V_{DD}$ starts to rise from zero to the steady-state value, the unbalanced condition of flip-flop 3, due to native transistors 15, 17 and the weak ground connection of input 20 via transistor 18, sets flip-flop 3 with output node 21 low and input node 20 high, so that the UP signal is zero, and the DW signal increases alongside $V_{DD}$. Since the DIS signal is low (circuit 2 disabled), the POR signal is high and follows the increase in $V_{DD}$. The output of inverter 11 is low, transistor 58 is off, and ground locking branch 12 is disabled. At this point, threshold detector 7 is also off, by virtue of supply voltage $V_{DD}$ being lower than the threshold value of cell 25. Transistor 5 provides for gradually charging capacitor 24 and pulling up bump supply line 4, the voltage $V_B$ of which increases alongside $V_{DD}$, less the voltage drop across diode-connected transistor 5. Upon voltage $V_B$ reaching the threshold value of transistor 35, transistor 35 is turned on to bring node 37 to voltage $V_B$, so that transistor 9 is turned on and keeps node 21 of flip-flop 3 grounded.

The above condition continues until voltage $V_{DD}$ of common supply line 6 reaches a level ensuring sufficient conductivity of cell 25. In this condition, cell 25 conducts a high current, capacitor 27 is charged, node 20 switches to low, the DW signal switches to low and the UP signal to high. Transistor 35 is turned off, transistor 36 is turned on to ground node 37 corresponding to the Br signal and transistor 9 is turned off. NOR gate 45 switches to switch the POR signal to zero with a small delay due to the charging of capacitor 46, thus terminating the power-on reset pulse used in a known manner for initialization by the other circuits of device 1 (including logic unit 40, as shown in FIG. 1). With a slight delay due to native transistor 52 and the charging of capacitor 55, zero switching of the POR signal also switches node 54 to high and turns on transistor 58 and ground locking branch 12. This ensures node 20 of flip-flop 3 is firmly grounded, thus consolidating the logic condition of flip-flop 3 and preventing any spurious switching in the event of interference.

In the event of a sudden fall in supply voltage $V_{DD}$ (bump situation), bump supply line 4 is immediately isolated from common supply line 6 by diode-connected transistor 5, which is now biased indirectly and maintains its value for a long period of time by virtue of capacitor 24.

In the event of a sharp bump (considerable fall in voltage $V_{DD}$), circuit 2 switches to generate a further POR pulse. That is, the fall in voltage $V_{DD}$ produces a corresponding fall in the UP signal latched to it. If the fall in the UP signal is sufficient to turn on transistor 35 (the source terminal of which is connected to isolated bump supply line 4, which maintains its former level), node 37 switches to high ($V_B$ value), and the Br signal switches to high to turn on transistor 9, which grounds node 21. Node 21 may be grounded rapidly by capacitor 23 discharging initially via diode 22 to the momentary value of $V_{DD}$ and then via turned-on transistor 9. Switching of the UP signal switches generating stage 10 to generate the POR pulse, which, even though low in view of the low level of $V_{DD}$, is capable of switching output 54 of inverter 11 to low, turning off transistor 58, and cutting off the ground connection of node 20. Node 20 therefore remains only weakly grounded by resistive transistor 18.

At the end of the bump condition, node 20, connected to $V_{DD}$ via capacitor 27 and only weakly grounded, is therefore the fastest in following the increase in supply voltage $V_{DD}$, and brings the DW signal to the value of $V_{DD}$ to confirm the low state of the UP signal. When the level of supply voltage $V_{DD}$ is sufficient to ensure a significant conductivity of cell 25, threshold detector 7 switches the flip-flop (DW signal low, UP signal high), turns off transistors 35 and 9, and switches generating stage 10, thus terminating the POR pulse, as described above for initialization of the device. Ground locking branch 12 is also enabled once more to provide firmer grounding of node 21.

If the bump is not sufficient to turn on transistor 35 and generate the POR pulse as described above, especially in the case of a low supply voltage $V_{DD}$, a POR pulse is nevertheless generated, only this time differently. That is, in the event of a fall in voltage on common line 6, capacitor 27, previously charged to voltage $V_{DD}$, tends to bring node 20 below ground. In actual fact, node 20 is not lowered greatly (at most it is lowered by a junction threshold—about 0.6 V—due to the diode associated with each directly biased PN junction) and capacitor 27 is partly discharged. Consequently, when voltage $V_{DD}$ returns to its normal value shortly after (assuming a fast bump condition), capacitor 27 latches node 20 to $V_{DD}$, so that node 20 switches to high, flip-flop 3 switches, node 21 is grounded, and a short POR pulse is generated. This mode is particularly useful in the case of a low supply voltage $V_{DD}$ (e.g. 3 V, with $V_B$ at 2 V), in which case, a considerable bump (a fall in $V_{DD}$ practically to ground level) would be required to turn on transistor 35 and generate the POR pulse as described in the first mode. With the mechanism described, on the other hand, the POR pulse is also generated even in the event of a low supply voltage.

The POR pulse generated in either one of the above two modes is supplied to the circuits (not shown) for generating an address transition detecting pulse ATD, to determine a further read cycle of the device, and therefore correct any errors caused by the bump situation in order to prevent malfunctioning of the device.

Circuit 2 also provides for generating a POR pulse when device 1 is turned off, in which case, the reduction in supply voltage $V_{DD}$ turns on transistor 35 and enables generating stage 10. Even though the voltage level of the POR pulse is low, the POR pulse obtained in this case may nevertheless be used by device 1 to prevent spurious conditions, such as spurious programming of the device.

Figure 3:
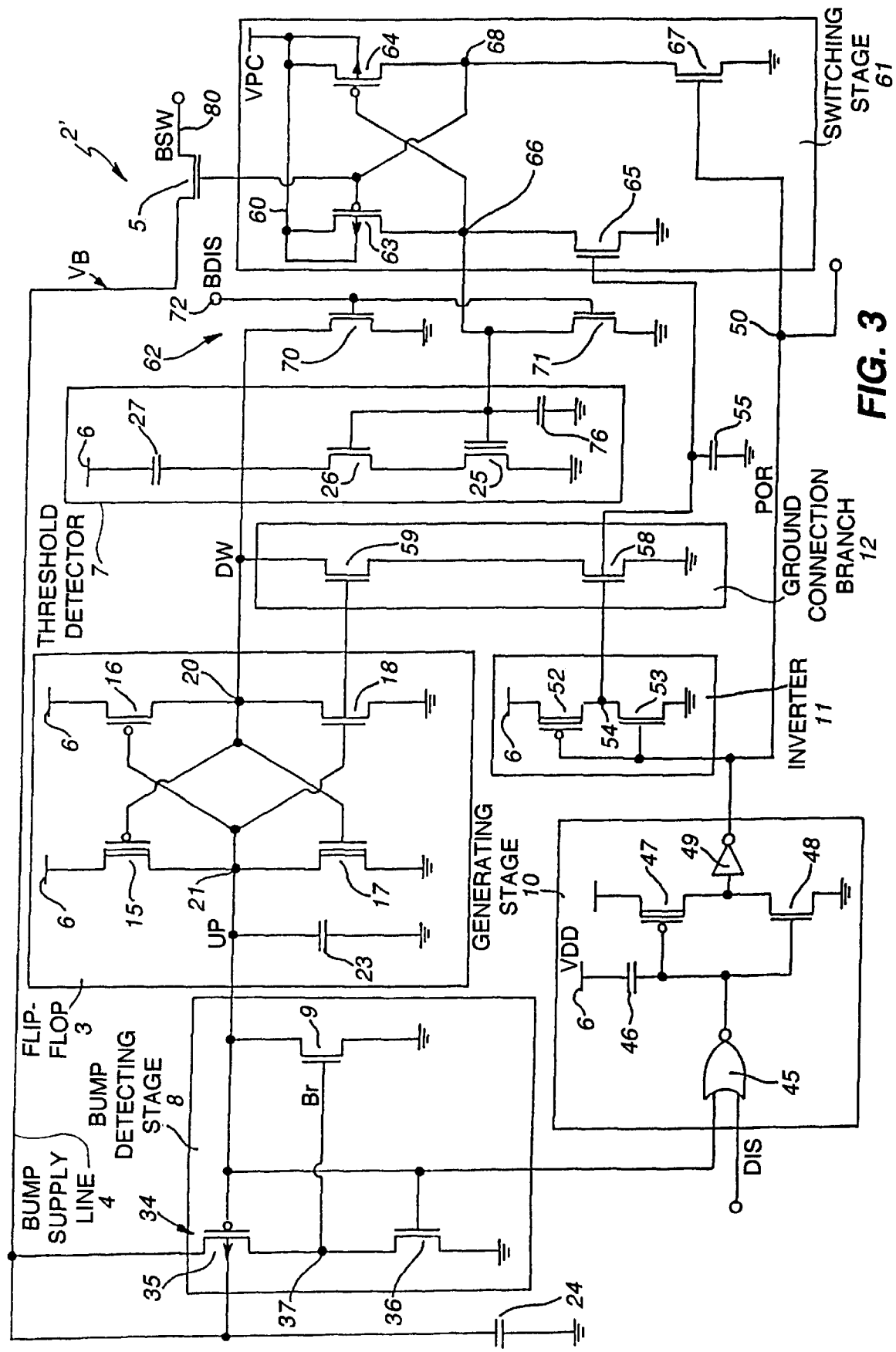
FIG. 3 shows a circuit diagram of a second embodiment of the present invention.

Circuit 2' in FIG. 3 is used in the presence of a first read supply voltage BSW greater than $V_{DD}$, and a second programming supply voltage VPC. Voltage BSW, corresponding to the voltage of the word lines in read mode (as stated, greater than $V_{DD}$ due, for example, to device 1 featuring a voltage booster circuit) is equal to VPC in read mode, and is isolated from VPC in programming mode (when VPC is brought to the programming value of, say, 12 V).

Circuit 2' therefore differs from circuit 2 in shown FIG. 1 by presenting, in addition to common supply line 6, a read supply line 80 at voltage BSW, a high-voltage supply line 60 at voltage VPC, and a switching stage 61. Circuit 2' also includes a power-off structure 62 for turning off threshold detector 7 at the end of the bump to prevent any high voltage reaching circuit 2' from damaging cell 25.

More specifically, switching stage 61 comprises two PMOS transistors 63, 64 with the source and well terminals connected to high-voltage supply line 60. Transistor 63 has the gate terminal (node 68) connected to the drain terminal of transistor 64, and the drain terminal (node 66) connected to the gate terminal of cell 25 and to the drain terminal of an NMOS transistor 65, which has the source terminal grounded and the gate terminal connected to node 54. Transistor 64 has the gate terminal connected to node 66, and the drain terminal connected to the drain terminal of an NMOS transistor 67, which has the source terminal grounded and the gate terminal connected to node 50.

Power-off structure 62 comprises two NMOS transistors 70, 71 with the gate terminals connected to each other and to an input node 72 of circuit 2' presenting a BDIS signal for disabling the bump detecting and POR pulse generating function when programming device 1. More specifically, transistor 70 has the drain terminal connected to input node 20 of flip-flop 3, and the source terminal grounded. Transistor 71 has the source terminal grounded and the drain terminal connected to the gate terminals of cell 25 and transistor 26 (node 66).

In circuit 2', isolation transistor 5 is no longer diode-connected, and has the gate terminal connected to node 68, and the drain terminal connected to read supply line 80. A capacitor 76 is provided between node 66 and ground.

Circuit 2' operates in the same way as Circuit 2 shown in FIG. 1, with the following exceptions. When circuit 2' is turned on, flip-flop 3 is set in exactly the same way as described above. Upon generation of the POR pulse, node 50 is high and node 54 low, so that transistor 65 stays off, and transistor 67 is turned on to ground node 68 and turns on transistor 63. Node 66 is latched to high-voltage supply line 60 at voltage VPC, now equal to BSW, so that the cell read voltage is transferred to the gate terminal of cell 25. The low level of node 68 maintains a low gate terminal of isolation transistor 5, which is therefore off and cuts off the connection between line 80 and bump supply line 4. At this point, therefore, voltage $V_B$ of circuit 2' remains low, and the BDIS signal is low to keep structure 62 off.

As in circuit 2, when voltage VPC reaches a level ensuring sufficient conductivity of cell 25, flip-flop 3 switches to terminate the POR pulse. As soon as the POR pulse is terminated, transistor 67 is turned off and transistor 65 turned on to switch switching stage 61. Node 68 switches to high, to voltage VPC, still equal to BSW, so as to diode connect isolation transistor 5, which provides for rapidly charging bump supply line 4 to voltage BSW, less the voltage drop across transistor 5. Node 66 is grounded to disconnect cell 25 from high-voltage line 60, which, during programming, reaches such voltage levels as to alter the characteristics and subsequently prevent correct operation of cell 25.

In the event of a bump, generation of the POR pulse (in either one of the two modes described above relative to circuit 2) switches switching stage 61, and supplies cell 25 with voltage VPC to monitor it as described.

To safely prevent the high VPC voltage from reaching threshold detector 7 when programming device 1, cell 25 and node 20 are forcibly grounded by transistors 70, 71 driven by the now high BDIS signal. This is also accompanied by switching stage 61 cutting off the path between high-voltage supply line 60 and cell 25, as described above.

The advantages of the circuit described are as follows. In particular, it provides for generating a POR pulse, not only when device 1 is turned on, but also in the event of a bump. The POR pulse is generated by virtue of bump supply line 4, which is precharged during normal operation of the device, and is completely isolated in the bump condition, so as to form a source of energy for resetting generating stage 10 and generating the POR pulse.

The circuit described also provides for generating the POR pulse in the event of a minor bump, and in particular in the event of a low supply voltage, thus ensuring device 1 is reset even in the worst conditions, as well as when the device is turned off, to ensure correct operation of the device.

By monitoring the read voltage of the cells by means of an element structurally and functionally equivalent to the device cells, the circuit described ensures the POR pulse is only terminated when conditions are such as to ensure correct reading of the cells and hence correct operation of the device.

The circuit described presents no static consumption, and no elements involving consumption on bump supply line 4, thus ensuring effective operation of line 4.

The presence of a modulatable grounding line provides for rapid response of the circuit at the end of the bump condition, with no impairment in the operation of the circuit itself, and with no danger of POR pulses being generated erroneously during normal operation of the device.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A power-on reset (POR) signal generating circuit comprising:
   a first line at a first reference potential;
   a generating stage that generates a POR pulse;
   a bump detecting means for detecting a bump on said first line;
   enabling means for enabling said generating stage in the presence of a bump;
   a bump supply line including voltage holding means, said bump supply line precharged during normal operation of a device; and
   an isolation stage interposed between said first line and said bump supply line, said isolation stage connecting said first line and said bump supply line in the absence of a bump, and cutting off the connection in the presence of a bump, thereby allowing said bump supply line to form a source of energy for resetting said generating stage.

2. The circuit as claimed in claim 1, wherein said bump detecting means includes:
   a first input connected to said first line; and
   a second input connected to said bump supply line and to an enabling output connected to said generating stage.

3. The circuit as claimed in claim 1, further including:
   end-of-bump detecting means connected to said first line and generating a disabling signal for disabling said generating stage at the end of the bump; and
   memory means connected to said first line for providing an input connected to said end-of-bump detecting means, and an output connected to said bump detecting means.

4. The circuit as claimed in claim 3, further comprising:
   a second line at a second reference potential;
   a third line at a third reference potential;
   a fourth line at a fourth reference potential; and
   switching means interposed between said fourth line and said end-of-bump detecting means, and connected to said generating stage to disconnect said fourth line from said end-of-bump detecting means in the absence of said POR pulse.

5. The circuit as claimed in claim 1, wherein said isolation stage comprises a first diode-connected transistor.

6. The circuit as claimed in claim 4, wherein said isolation stage comprises a MOS transistor having a first and second terminal connected to said second line and to said bump supply line, and a control terminal connected to said fourth line via said switching means.

7. The circuit as claimed in claim 2, wherein said bump detecting means further includes:
   a second transistor, said second transistor having a first terminal connected to said bump supply line, a control terminal connected to said input of said bump detecting means, and a second terminal; and
   a third transistor, said third transistor having a first terminal connected to said input of said bump detecting means, and a control terminal connected to said second terminal of said second transistor.

8. The circuit as claimed in claim 4,
   wherein said end-of-bump detecting means comprises a nonvolatile memory cell having a first terminal connected to said first line via connecting means, a second terminal connected to said third line, and a control terminal connected to said first line.

9. The circuit as claimed in claim 7, further including a connecting means for connecting an end-of-bump detecting means to the first line and wherein said connecting means comprises a fourth MOS transistor and a capacitive element.

10. The circuit as claimed in claim 3, wherein said memory means comprises:
    a naturally unbalanced flip-flop including:
       an input connected to an output of said generating stage and to an output of said end-of-bump detecting means; and
       an output connected to an input of said bump detecting means and an input of said generating stage.

11. The circuit as claimed in claim 9, further comprising a second line at a second reference potential; and
    a third line at a third reference potential; wherein said memory means comprises a flip-flop having an input and an output, the flip-flop comprising:
       a fifth and sixth transistor of PMOS type, said fifth transistor being a native type and being interposed between said first line and said output of said flip-flop; said sixth transistor being interposed between said first line and said input of said flip-flop; and
       a seventh and eighth transistor of NMOS type, said seventh transistor being a native type and being interposed between said output of said flip-flop and said third line; said eighth transistor being a resistive type and being interposed between said input of said flip-flop and said third line.

12. The circuit as claimed in claim 11, further including:
    a connection stage interposed between said input of said flip-flop and said third line, said connection stage comprising a disabling input connected to said generating stage and receiving said POR impulse from said generating stage to connect said input of said flip-flop to said third line in the absence of said POR pulse.

13. The circuit as claimed in claim 12, wherein said connection stage comprises:
    a connection transistor having a first terminal connected to said input of said flip-flop;
    a control terminal connected to said output of said flip-flop; and
    a second terminal connected to said third line via a switching transistor having a control terminal connected to the output of said generating stage.

14. The circuit as claimed in claim 1, wherein said first reference potential is a common supply voltage.

15. The circuit as claimed in claim 4, wherein said second reference potential is greater than said first reference potential.

16. The circuit as claimed in claim 4, wherein said third reference potential is ground.

17. The circuit as claimed in claim 4, wherein said fourth reference potential is a programming supply voltage.

18. A method for facilitating correct operation of a device comprising the steps of:
    precharging a bump supply line;
    resetting a means for generating a power-on reset (POR) signal by using said bump supply line;
    generating a POR signal; and
    terminating a POR signal,
    wherein said step of terminating further includes:
       monitoring read voltages of memory cells; and
       using said read voltages to determine if condition for terminator exists, said condition occurring when said voltages reach a level ensuring sufficient conductivity of said cells thereby ensuring correct reading of said memory cells.

19. The method of claim 18, wherein said step of generating a POR signal occurs when said device is turned on and when a bump occurs.

20. The method of claim 18, wherein said bump supply line includes voltage holding means.

21. The circuit as claimed in claim 10, wherein said bump detecting means further includes:
a second transistor, said second transistor having a first terminal connected to said bump supply line, a control terminal connected to said input of said bump detecting means, and a second terminal; and
a third transistor, said third transistor having a first terminal connected to said input of said bump detecting means, and a control terminal connected to said second terminal of said second transistor;
and wherein said flip-flop comprises:
a fifth and sixth transistor of PMOS type, said fifth transistor being a native type and being interposed between said first line and said output of said flip-flop; said sixth transistor being interposed between said first line and said input of said flip-flop; and
a seventh and eighth transistor of NMOS type, said seventh transistor being a native type and being interposed between said output of said flip-flop and a ground potential; said eighth transistor being a resistive type and being interposed between said input of said flip-flop and the ground potential.

22. The circuit as claimed in claim 21, wherein the memory means further comprises a diode connected to the fifth transistor.

23. The circuit as claimed in claim 21, further including:
a connection stage interposed between said input of said flip-flop and said ground potential, said connection stage comprising a disabling input connected to said, generating stage and receiving said POR impulse from said generating stage to connect said input of said flip-flop to said ground potential in the absence of said POR pulse.

24. The circuit as claimed in claim 23, wherein said connection stage comprises:
a connection transistor having a first terminal connected to said input of said flip-flop;
a control terminal connected to said output of said flip-flop; and,
a second terminal connected to said ground potential via a switching transistor having a control terminal connected to the output of said generating stage.

25. A reset signal generating circuit comprising:
a common supply line at a first reference potential;
a reset signal generator;
a bump detector that detects a bump on the common supply line, the bump detector connected to a bump supply line and connected to the reset signal geneator;
a bump supply line including a voltage storage device whereby the bump supply line is precharged during normal operation of a device; and
an isolation device connected between the common supply line and the bump supply line, wherein the isolation device connects the common supply line and the bump supply line in the absence of a bump and cuts off the connection in the presence of the bump, to allow the bump supply line to form a source of energy for resetting the reset signal generator.

26. The reset signal generating circuit of claim 25, further including:
an end-of-bump detector connected to the first line and connect to provide a disable signal to the reset signal generator at the end of the bump; and
a memory storage device connected to the common supply fine for providing an input connected to the end-of-bump detector, and an output-connected to the bump detector.

27. The reset signal generating circuit of claim 26, further including:
a connection branch connected between an input of the memory storage device and a ground potential, the connection branch having an input connected to the reset signal generator.

28. The reset signal generating circuit of claim 27, further including:
an inverter having an input connected to the output of the reset signal generator and having an output connected to the input of the connection branch.

29. The reset signal generating circuit of claim 25, wherein the bump detector includes:
a first input connected to the common supply line; and
a second input connected to the bump supply line and to an enabling output connected to the reset signal generator.

30. The reset signal generating circuit of claim 29, wherein the bump detector includes a first and a second transistor, the first transistor having a first terminal connected to the bump supply line, a control terminal connected to the first input of the bump detector and a second terminal, and the second transistor having a first terminal connected to the second input of the bump detector and a control terminal connected to the second terminal of the first transistor.

31. The reset signal generating circuit of claim 25, wherein the isolation device includes a first diode connected transistor.

32. The reset signal generating circuit of claim 26, wherein the memory storage device includes:
a naturally unbalanced flip-flop connected to an output of the reset signal generator and having an output connected to the bump detector.

33. The reset signal generating circuit of claim 32, further including a diode connected to the flip-flop.

34. The reset signal generating circuit of claim 26, wherein the end-of-bump detector includes:
a first capacitor connected between the common supply line and a first terminal of an NMOS transistor;
a nonvolatile memory cell having a first terminal connected to a second terminal of the NMOS transistor, a second terminal of the nonvolatile memory cell being connected to a ground potential.

35. The reset signal generating circuit of claim 34, wherein the end-of bump detector further includes:
a second capacitor connected between the ground potential and a third terminal of the nonvolatile memory cell and a third terminal of the NMOS transistor.

36. The reset signal generating circuit of claim 28, wherein the inverter includes:
a PMOS transistor having a first terminal connected to the common supply line, a control terminal, and a second terminal connected to the input of the connection branch; and
an NMOS transistor having a first terminal connected to the second terminal of the PMOS transistor, a second terminal connected to the ground potential, and a control terminal connected to the control terminal of the PMOS transistor and connected to the output of the reset signal generator.

37. The reset signal generating circuit of claim 36, wherein a capacitor is connected to the ground potential and to a node defined by the connection of the second terminal of the PMOS transistor to the first terminal of the NMOS transistor.

38. The reset signal generating circuit of claim 25, further including:

a high voltage supply line; and a switching stage having an input connected to the high voltage supply line, having an input connected to the reset signal generator, and having a disabling output connected to an end-of-bump detecting means, the switching stage disconnecting the high voltage supply line from the end-of bump detecting means in the absence of the reset signal.

* * * * *

UNITED STATES PATENT AND TRADEMARK OFFICE
CERTIFICATE OF CORRECTION

PATENT NO. : 5,959,476
DATED : September 28, 1999
INVENTOR(S) : Luigi Pascucci

It is certified that error appears in the above-identified patent and that said Letters Patent is hereby corrected as shown below:

Col. 1, line 7, should read:

The present invention relates integrated circuits anf more

Col. 1, line 21, should read:

r apid fall (bump) in supply. This fall in supply may

Col. 1, line 53, should read:

FIGS. 2a-2e show a time plot of a number of electric quantities

Signed and Sealed this

Ninth Day of May, 2000

*Attest:*

Q. TODD DICKINSON

*Attesting Officer*      *Director of Patents and Trademarks*

UNITED STATES PATENT AND TRADEMARK OFFICE
CERTIFICATE OF CORRECTION

PATENT NO. : 5,959,476
DATED : September 28, 1999
INVENTOR(S) : Luigi Pascucci

It is certified that error appears in the above-identified patent and that said Letters Patent is hereby corrected as shown below:

Col. 1, line 7, should read:

The present invention relates to integrated circuits and more

Col. 1, line 21, should read:

rapid fall (bump) in supply. This fall in supply may

Col. 1, line 53, should read:

FIGS. 2a-2e show a time plot of a number of electric quantities

Signed and Sealed this

Twelfth Day of December, 2000

Attest:

Q. TODD DICKINSON

*Attesting Officer*      *Director of Patents and Trademarks*